(12) United States Patent
Podell et al.

(10) Patent No.: US 8,487,716 B1
(45) Date of Patent: Jul. 16, 2013

(54) SINGLE-ENDED PHASE-SHIFT NETWORK

(71) Applicant: Werlatone, Inc., Brewster, NY (US)

(72) Inventors: Allen F. Podell, Palo Alto, CA (US);
Ky-Hien Do, Mississauga (CA);
Gregory Pflaum, Ridgefield, CT (US)

(73) Assignee: Werlatone, Inc., Brewster, NY (US)

( * ) Notice: Subject to any disclaimer, the term of this patent is extended or adjusted under 35 U.S.C. 154(b) by 0 days.

(21) Appl. No.: 13/622,862

(22) Filed: Sep. 19, 2012

(51) Int. Cl.
*H03H 7/18* (2006.01)
*H03H 7/38* (2006.01)
*H01P 3/00* (2006.01)
*H01P 3/08* (2006.01)

(52) U.S. Cl.
USPC ............ 333/138; 333/124; 333/160; 333/161

(58) Field of Classification Search
USPC .................... 333/25, 124, 160, 190, 138, 161
See application file for complete search history.

(56) References Cited

U.S. PATENT DOCUMENTS

| | | | |
|---|---|---|---|
| 1,953,459 A | 4/1934 | Bennett | |
| 2,029,698 A | 2/1936 | Bode | |
| 2,147,728 A | 2/1939 | Wintringham | |
| 2,392,476 A | 1/1946 | Hodgson | |
| 3,127,555 A | 3/1964 | Honore et al. | |
| 3,231,837 A | 1/1966 | O'Meara | |
| 3,449,696 A | 6/1969 | Routh | |
| 3,484,724 A | 12/1969 | Podell | |
| 3,518,581 A | 6/1970 | Hughes et al. | |
| 3,529,233 A | 9/1970 | Podell | |
| 3,560,894 A * | 2/1971 | Fettweis | 333/190 |
| 4,945,321 A * | 7/1990 | Oppelt et al. | 333/119 |
| 7,085,389 B1 * | 8/2006 | Modafferi | 381/99 |
| 2005/0082687 A1 * | 4/2005 | Prokofiev et al. | 257/785 |
| 2006/0152304 A1 * | 7/2006 | Liang et al. | 333/176 |
| 2009/0134953 A1 * | 5/2009 | Hunt et al. | 333/168 |
| 2012/0256700 A1 | 10/2012 | Podell | |

OTHER PUBLICATIONS

Mutual Inductance; http://www.electronics-tutorials.ws; Oct. 11, 2009.*
Hellerstein, "Synthesis of All-Pass Delay Equalizers", IRE Transactions on Circuit Theory, Sep. 1961, pp. 215-222, vol. 8, issue 3.
Hunton, "New Differential Phase Shift Networks Combining All-Pass and Band-Pass Elements", Microwave Symposium Digest, Jun. 1981, I.E.E.E., pp. 223-225, Los Angeles, California.

(Continued)

*Primary Examiner* — Benny Lee
*Assistant Examiner* — Rakesh Patel
(74) *Attorney, Agent, or Firm* — Kolisch Hartwell, PC

(57) ABSTRACT

A phase-shift network may include a lattice network including a first capacitor coupling a first circuit node to a second circuit node, a second capacitor coupling a third circuit node to a fourth circuit node, and a first inductor coupling the first circuit node to the fourth circuit node. A first coupled section may couple a single-ended input node to the lattice network. A second coupled section may couple the lattice network to a single-ended output node. Each coupled section may include a plurality of conductors that may form a transmission line, such as a coaxial transmission line or a stripline. A high-pass circuit may couple the input node to the first coupled section. A phase difference network may include a signal divider producing two intermediate signals coupled to respective phase-shift networks producing output signals having substantially constant phase difference over a frequency range.

11 Claims, 3 Drawing Sheets

OTHER PUBLICATIONS

Bedrosian, "Normalized Design of 90 Phase-Difference Networks", IRE Transactions on Circuit Theory, Jun. 1960, pp. 128-136, vol. 7, issue 2.

Pearson, S. Ivar and Maler, George J., "Introductory Circuit Analysis" from Basic Concepts of Circuit Theory, Copyright 1965, pp. 54-59 and 70-71, Department of Electrical Engineering, University of Colorado, Boulder, Colorado.

US Patent and Trademark Office, Office action regarding U.S. Appl. No. 13/083,180 dated Jan. 22, 2013, 18 pages.

* cited by examiner

SINGLE-ENDED PHASE-SHIFT NETWORK

BACKGROUND OF THE DISCLOSURE

An all-pass phase-shift network is an electrical circuit that ideally passes all frequencies of operation equally in magnitude, but changes the phase relationship over a range of frequencies. The phase-relationship variation is accomplished by the fact that the propagation delay of the phase-shift circuit varies with frequency. In other words, a phase-shift network provides phase shift or phase delay without appreciably altering the magnitude characteristic of the electrical signal passing through it. Hence, a phase-shift network may be useful in various electronic applications.

Phase-shift networks having frequency cutoffs outside the bandwidth of interest are useful in high-frequency coupling circuits. Such networks may be employed in various forms of hybrid couplers or other directional coupling circuits. These networks are discussed in our prior U.S. application Ser. No. 13/083,180 filed on Apr. 8, 2011.

BRIEF SUMMARY OF THE DISCLOSURE

A phase-shift network may include a lattice network coupling a first coupled section to a second coupled section. The lattice network may include a first capacitor coupling a first circuit node to a second circuit node, a second capacitor coupling a third circuit node to a fourth circuit node, and a first inductor coupling the first circuit node to the fourth circuit node. The first coupled section may include a first conductor coupling a single-ended input node to the first circuit node and a second conductor connected between a circuit ground and the third circuit node. The second conductor may be inductively coupled to the first conductor. Similarly, the second coupled section may include a third conductor coupling a single-ended output node to the fourth circuit node and a fourth conductor connected between the circuit ground and the second circuit node. The fourth conductor may be inductively coupled to the third conductor.

The first and second conductors may form a first transmission line, and the third and fourth conductors may form a second transmission line. These transmission lines may be, for example, coaxial or planar transmission lines.

The first coupled section may further include a fifth conductor connected electrically in parallel with the second conductor, and the second coupled section may further include a sixth conductor connected electrically in parallel with the fourth conductor. In some examples, the first and second coupled sections may be striplines.

In a further example, a phase-difference network may comprise a signal divider for dividing a single-ended input into first and second intermediate single-ended signals. A first phase-shift network may be responsive to the first intermediate single-ended signal for producing an output single-ended signal having a first phase that varies with frequency over a given frequency range. A second phase-shift network may be responsive to the second intermediate single-ended signal for producing an output single-ended signal having a second phase that varies with frequency and is different from the first phase by a given amount that is substantially constant over the given frequency range.

DETAILED DESCRIPTION OF EMBODIMENTS

Figure 1:
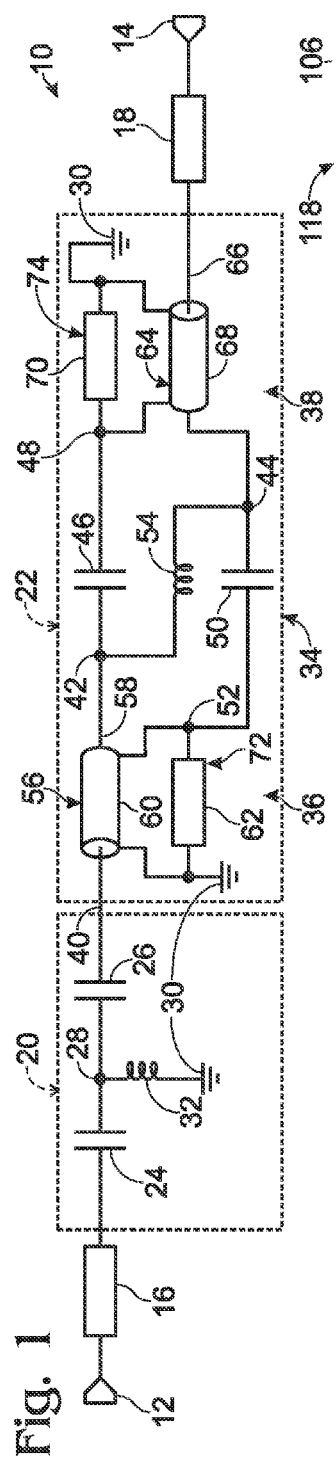
FIG. 1 is a general circuit diagram showing an example of a single-ended phase-shift network.

Referring to FIG. 1, a phase-shift network shown generally at 10 may connect an external single-ended (unbalanced) source at a source or input node 12 to a single-ended (unbalanced) load at a load or output node 14. Phase-shift network 10 may include an input feed line 16 connected to source node 12 and an output feed line 18 connected to load node 14. Input feed line 16 may be followed by a high-pass circuit 20. A phase-shift circuit 22 may be connected between high-pass circuit 20 and output feed line 18.

High-pass circuit 20 may include two series capacitors 24 and 26. An electrical node 28 extending between capacitors 24 and 26, may be shunted to a circuit ground 30 by an inductor 32 to complete this example of high-pass circuit 20.

Phase-shift circuit 22 may include a modified lattice network 34 extending between two diagonally symmetrical coupled sections 36 and 38. Phase-shift circuit 22, generally, and coupled section 36, specifically, may be coupled to high-pass circuit 20 through an input circuit node 40. Coupled section 36 may be coupled to lattice network 34 through an input network node 42. Lattice network 34 may in turn be coupled to coupled section 38 by an output network node 44.

Lattice network 34 may include a first in-line capacitor 46 connecting node 42 to a second output network node 48. A second in-line capacitor 50 may couple a second input network node 52 to output network node 44. A cross-connect inductor 54 may cross-connect a first port of capacitor 46 at node 42 to a second port of capacitor 50 at network node 44.

Coupled section 36 may include a coaxial transmission line 56 having a center conductor 58 connecting node 40 to node 42, and a shield or outer conductor 60 connecting node 52 to circuit ground 30. Coupled section 36 may also include a third conductor 62 electrically in parallel with outer conductor 60 between node 52 and circuit ground. As is well known, the conductors of a transmission line, such as conductors 58 and 60 of transmission line 56, are inductively coupled. Other structures providing inductive coupling between conductors may be used.

Coupled section 38 may include a coaxial transmission line 64 having a center conductor 66 coupling node 44 to output node 14 via feed line 18, and a shield or outer conductor 68 connecting node 48 to circuit ground 30. Coupled section 36 may also include a third conductor 70 electrically in parallel with outer conductor 68 between node 48 and circuit ground.

It is thus seen that capacitor 46 may connect the center conductor of coaxial transmission line 56 to the outer conductor of coaxial transmission line 64. Capacitor 50 may connect the outer conductor of coaxial transmission line 56 to the center conductor of coaxial transmission line 64. Third conductors 62 and 70 may also be conductors of respective high impedance transmission lines 72 and 74 relative to circuit ground.

Together, the tri-conductor structures of these examples of coupled sections 36 and 38 and the modified lattice network 34 may form a circuit whose electrical response resembles that of a conventional lattice circuit being fed by ideal baluns, over an entire bandwidth of interest.

Figure 2:
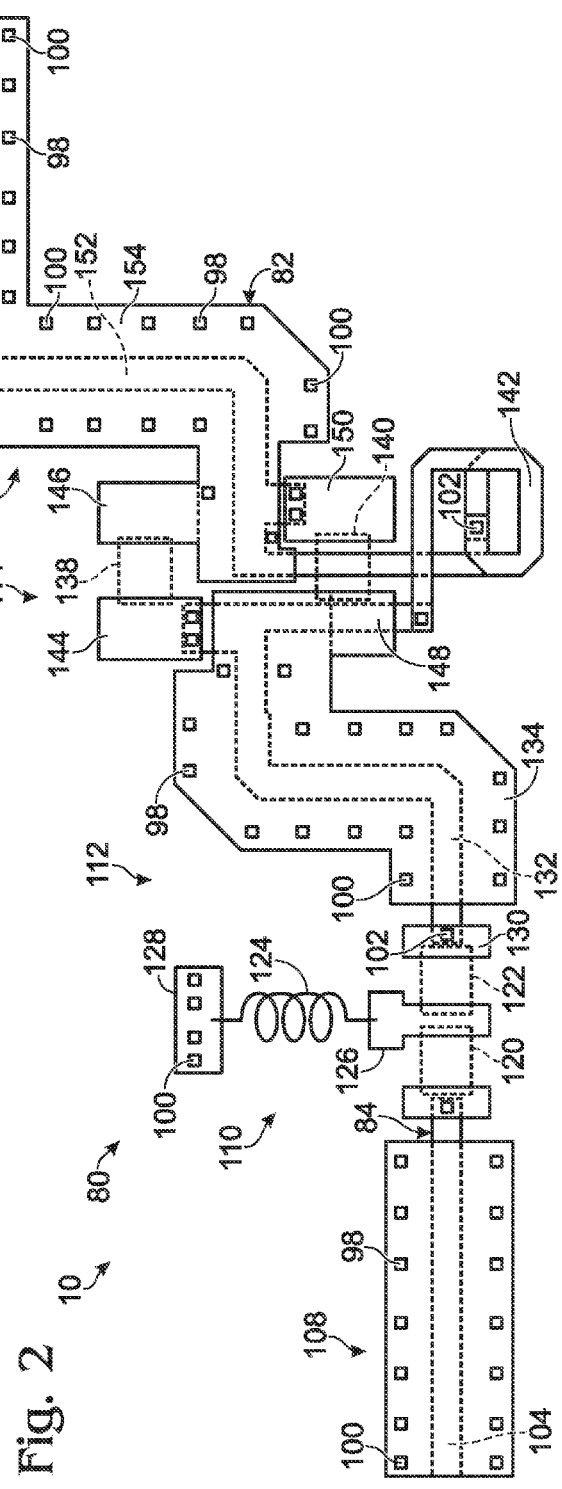
FIG. 2 is an illustration of an example of a printed circuit that may be used as the phase-shift network of FIG. 1.
Figure 3:
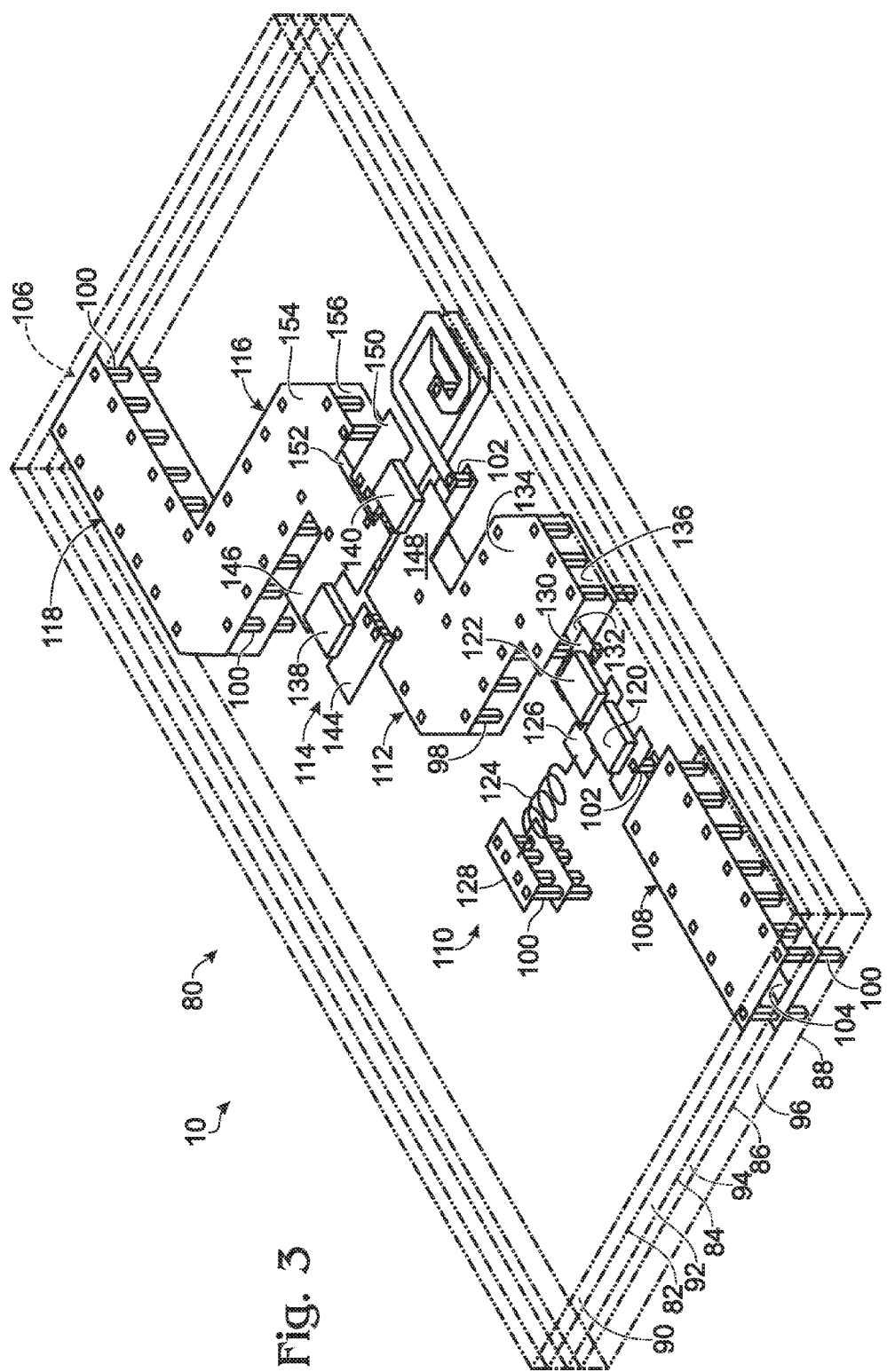
FIG. 3 is an isometric view of the printed circuit of FIG. 2.

A further embodiment for realizing phase-shift network 10 is a phase-shift network 80, an example of which is illustrated by printed-circuit board metallization shown in FIGS. 2 and 3. FIG. 2 is a top view and FIG. 3 is an isometric view of phase-shift network 80. Generally in this example, phase-shift network 80 may include three layers 82, 84, 86 of metallization, situated above a ground plane 88. The top and bottom layers 82 and 86 of metallization may have virtually the same layout (with some exceptions), while the center layer 84 may be visually seen as the thinner metallization layer in FIGS. 2 and 3. Top metallization layer 82 is shown in solid lines in FIG. 2.

All metallization layers may be separated by suitable substrates 90, 92, 94, 96, having thicknesses and dielectric constants appropriate for the design application. The dielectric substrates are not shown but are represented by the layers separated by dash-double-dot lines drawn around the respective illustrated metallization layers. Top metallization layer 82 is disposed between substrates 90 and 92, intermediate or center metallization layer 84 is disposed between substrates 92 and 94, bottom metallization layer 86 is disposed between substrates 94 and 96, and ground plane 88 covers the lower surface of substrate 96. Connections between top and bottom metallization layers are provided by vias 98. Vias 100 connect metallization layers 82 and 86 with ground plane 88. Vias 102 provide connections between metallization on two adjacent levels, such as between metallization layer 82 and 84. It is seen that the metallization layout is compact and symmetrical, allowing signal propagation in either direction between respective pairs of input and output nodes.

From the left of the drawings of FIGS. 2 and 3, a single-ended connection or input node 104 may be made to the center layer 84. Similarly, from the right of the drawings of FIGS. 2 and 3, a single-ended connection or output node 106 may be made to the center layer.

Extending from node 104, the three metallization layers form an input feed line 108, in the form of a stripline, corresponding to feed line 16. Each stripline has a narrow planar center conductor of metallization layer 84 disposed between and inductively broadside coupled to two wider planar outer conductors formed in metallization layers 82 and 86. Feed line 108 may be followed by a high-pass circuit 110 corresponding to high-pass circuit 20. A coupled section in the form of a tri-conductor structure 112 formed as a stripline may be connected between high-pass circuit 110 and a modified lattice network 114 corresponding to lattice network 34. A second coupled section in the form of a second tri-conductor structure 116 or stripline connects lattice network 114 to an output feed line 118, also formed as a stripline. Tri-conductor structure 116 and feed line 118 are seen to form a continuous stripline. Output feed line 118 may connect tri-conductor structure 116 to output node 106.

High-pass circuit 110 may include surface-mounted capacitors 120 and 122 (shown as dashed boxes in FIG. 2) and an air-core inductor 124. Capacitors 120 and 122 may be connected in series with the center metallization layer of the printed-circuit board, whereas inductor 124 may connect a junction or node 126, between capacitor 120 and capacitor 122, to a ground pad 128 connected to ground plane 88 by vias 100.

High-pass circuit 110 may connect to tri-conductor structure 112 at a circuit node 130. Tri-conductor structure 112 may include a center metallization conductor 132 and top and bottom metallization conductors 134 and 136. The ends of conductors 134 and 136 proximate to high-pass circuit 110 are connected to ground plane 88 by grounding vias 100.

Lattice network 114 may include surface-mounted capacitors 138 and 140 (shown as dashed boxes in FIG. 2) and a printed spiral inductor 142 formed of metallization on metallization layers 82 and 84 along with appropriate non-grounded vias 102. Capacitor 138 connects center-metallization conductor 132 at a node 144 with top-metallization conductor 146 at a node 146. Capacitor 140 connects top-metallization conductor 134 at a node 148 with a node 150.

Tri-conductor structure 116 may include center metallization conductor 152 and top and bottom metallization conductors 154 and 156. Center metallization conductor 152 is connected to node 150 and top and bottom metallization conductors 154 and 156 are connected to node 146. Two vias 100 proximate to output feed line 118 connect metallization conductors 154 and 156 to the ground plane.

The printed structures in phase-shift network 80 produce distributed capacitive and inductive parasitics that may be analyzed using appropriate electromagnetic simulation tools. It is therefore appreciated that phase-shift network 80 is realizable in a compact three-layer configuration, such as on a printed-circuit board. Other configurations and embodiments will also be apparent to one skilled in the art.

Figure 4:
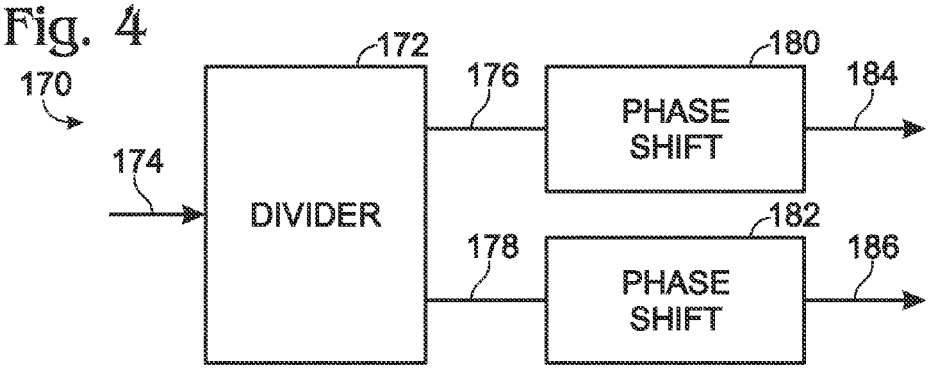
FIG. 4 is a block diagram of an example of a phase-difference network that may include the phase-shift network of FIG. 1.

Phase-shift network 80, and correspondingly phase-shift network 10 by relation, may be used as components in other circuits. For instance, an example of a phase-difference network 170 that may be formed with at least one phase-shift network 10 is illustrated in FIG. 4. Phase-difference network 170 may include a signal divider 172 having an input 174 for receiving a single-ended (unbalanced) input signal and two outputs 176 and 178 for transmitting two intermediate single-ended (unbalanced) signals. A phase-shift network may be cascaded to each output of divider 172. More specifically, a phase-shift network 180 may connect to output 176 and a phase-shift network 182 to output 178, all in a single-ended (unbalanced) manner. As mentioned, phase-shift networks 180 and 182 may each include a phase-shift network 10 or 80 as described above. Phase-shift networks 180 and 182 may produce respective outputs 184 and 186.

Phase-difference network 170 may be designed to operate at a design frequency or over a given frequency bandwidth. The phase-difference network may produce output signals on outputs 184 and 186 that vary in phase and have a relatively constant phase difference between output signals, over the frequency range of interest.

In some examples, phase-shift networks 180 and 182 may vary in phase angle from near zero at low frequencies to a higher value at high frequencies. Often, the two phase-shift networks may shift the phase angles of the respective output signals on outputs 184 and 186 by a generally consistent amount. For example, the difference in phase angles of the two output signals may be near or at 90-degrees over the bandwidth of interest of the phase-difference network 170.

In an example of phase-difference network 170 designed to operate over the frequency range of 20 MHz to 1000 MHz, within a 25-ohm environment, phase-shift network 180 may follow the configuration of phase-shift network 10 or 80 and thus may include capacitors 24 and 26 of about 618 pF each, inductor 32 of about 231 nH, capacitors 46 and 50 of about 22.5 pF each, inductor 54 of about 14 nH, coaxial transmission lines 56 and 64 of 25-ohm characteristic impedance each and transmission lines 72 and 74 of 70-ohm characteristic impedance each.

In this example, phase-shift network 182 may be any phase-shift network that provides a sufficiently consistent phase difference relative to the phase angle produced by phase-shift network 180. For instance, phase-shift network 182 may include a conventional lattice network (not shown) with in-line inductors of about 70 nH each and cross-connect capacitors of about 106 pF each.

Phase-shift network 182 may include one or more delay lines (not shown) that may be situated within the phase-shift network at a suitable location so as to contribute a corresponding fixed phase-offset in the associated signal path. A delay line has a fixed time delay. Therefore it adds a phase shift that is linear with frequency. In this design, it is a low cost replacement for a lattice or other network having small delay. For example, phase-shift network 182 may include a delay line connected to the conventional lattice network to provide a pre-determined total phase shift suitable for the purpose of producing the phase difference of 90 degrees when compared to the phase angle of phase-shift network 180.

An example of the block diagram of FIG. 4 was designed with phase-shift networks 180 and 182 having alternating rollover frequencies along the bandwidth of interest. A rollover frequency is defined as the frequency at which the time delay produced by a network is at a local maximum. A simple phase-shift network therefore may have a single rollover frequency. A more complex phase-shift network may have multiple rollover frequencies.

For the frequency range of 20 MHz to 1000 MHz, phase-shift network 180 might ideally have rollover frequencies approximately at 15 MHz and 270 MHz and phase-shift network 182 (not shown) might ideally have a rollover frequency at 70 MHz. A delay network provides the highest frequency rollover for network 182. A simulation of phase-difference network 170 with the reactance values given above produced rollovers at about 13.3 MHz, 58.4 MHz, and 283.6 MHz.

Figure 5:
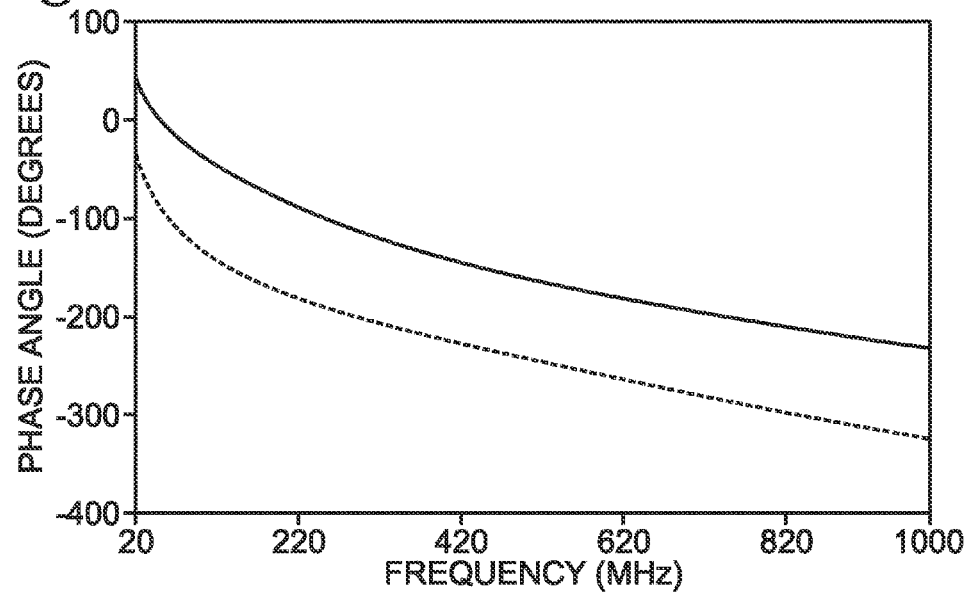
FIG. 5 is a chart illustrating phase shift as a function of frequency for the phase-difference network of FIG. 4.
Figure 6:
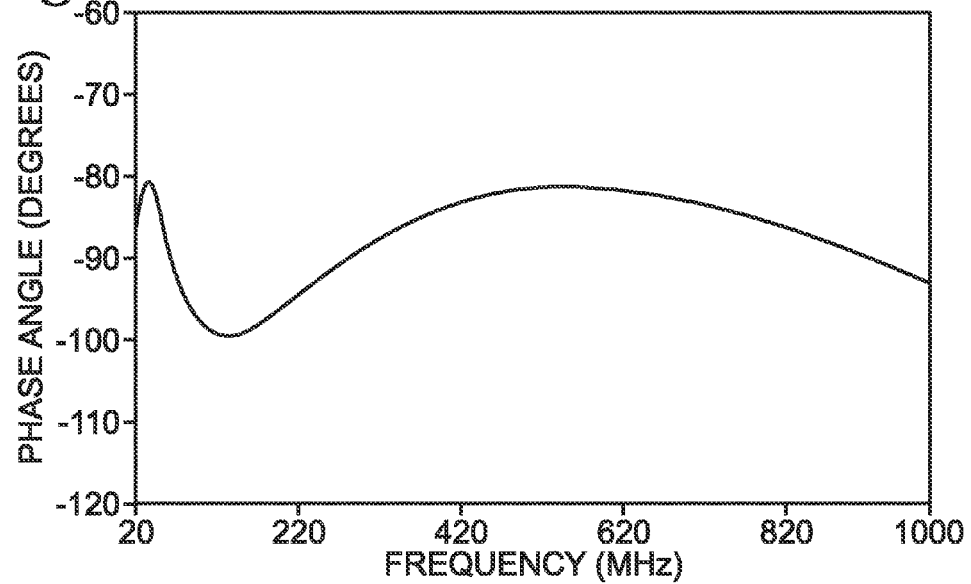
FIG. 6 is a chart illustrating phase-difference over a bandwidth of interest for the two outputs of the phase-difference network shown in FIG. 4.

When physically constructed, an embodiment of phase-shift network 180 may produce signals having the phase angles shown by the solid upper trace in FIG. 5. As seen, the phase angle shifts gradually from about +40 degrees at 20 MHz to about –230 degrees at 1000 MHz. On the other hand, the phase-shift network 182 may produce signals having the phase characteristics depicted by the dashed lower trace in FIG. 5. As seen, the phase angle shifts gradually from –50 degrees at 20 MHz to about –320 degrees at 1000 MHz. FIG. 6 illustrates the calculated difference in phases of the two output signals on outputs 184 and 186. As seen, the phase difference is substantially constant, varying between –81 degrees and –99 degrees over the frequency range from 20 MHz to 1000 MHz, which translates to about +/–9 degrees from the nominal value of –90 degrees.

It will be appreciated that the above phase-shift network demonstrates the phase-shift characteristic of the lattice type without the frequency limitations, and is inherently single-ended by nature. Accordingly, this phase-shift network may possess ultra-wide bandwidth and high power-handling capability simultaneously.

For thermal management purposes, phase-shift networks 10 and 80 may possess low insertion loss, allowing them to handle high power with limited heat dissipation. Furthermore, the described phase-shift networks may be constructed to be compact and repeatable, for the purpose of manufacturability.

Single-ended phase-shift networks 10 and 80 may be employed within a phase-difference network, such as phase-difference network 170, to create a three-port component whose two output ports have essentially the same amplitude responses and have phase responses separated by a prescribed amount, over a very wide bandwidth. The insertion loss of the three-port component may be reduced and the return losses at all three ports may be also reduced so that the three-port component may handle high power over a wide bandwidth.

The above description is intended to be illustrative and not restrictive. Many other embodiments will be apparent to those skilled in the art, upon reviewing the above description. Accordingly, while embodiments of phase-shift networks, a phase-difference network, and methods of phase shifting have been particularly shown and described, many variations may be made therein. This disclosure may include one or more independent or interdependent inventions directed to various combinations of features, functions, elements and/or properties. Other combinations and sub-combinations of features, functions, elements and/or properties may be claimed. Such variations, whether they are directed to different combinations or directed to the same combinations, whether different, broader, narrower or equal in scope, are also regarded as included within the subject matter of the present disclosure.

The foregoing embodiments are illustrative, and no single feature or element, or combination thereof, is essential to all possible combinations. Where "a" or "a first" element or the equivalent thereof is recited, such terms include one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated. Ordinal indicators may be applied to associated elements in the order in which they are introduced in a given context, and the ordinal indicators for such elements may be different in different contexts.

What is claimed is:

1. A phase-shift network comprising:
   a lattice network including a first capacitor coupling a first circuit node to a second circuit node, a second capacitor coupling a third circuit node to a fourth circuit node, and a first inductor coupling the first circuit node to the fourth circuit node;
   a first coupled section including a first conductor coupling a single-ended input node to the first circuit node and a second conductor connected between a circuit ground and the third circuit node, the second conductor being inductively coupled to the first conductor; and
   a second coupled section including a third conductor coupling a single-ended output node to the fourth circuit node and a fourth conductor connected between the circuit ground and the second circuit node, the fourth conductor being inductively coupled to the third conductor.

2. The phase-shift network of claim 1, wherein the first and second conductors form a first transmission line, and the third and fourth conductors form a second transmission line.

3. The phase-shift network of claim 2, wherein at least one of the first and second transmission lines is a coaxial transmission line.

4. The phase-shift network of claim 2, wherein the first and second conductors are planar broadside-coupled conductors and the third and fourth conductors are planar broadside-coupled conductors.

5. The phase-shift network of claim 1, wherein the first coupled section further includes a fifth conductor connected electrically in parallel with the second conductor, and the second coupled section further includes a sixth conductor connected electrically in parallel with the fourth conductor.

6. The phase-shift network of claim 5, wherein the fifth conductor is also inductively coupled to the first conductor and the sixth conductor is also inductively coupled to the third conductor.

7. The phase-shift network of claim 5, wherein the first and second coupled sections are striplines.

8. The phase-shift network of claim 5, wherein the first and second conductors are conductors of a first coaxial transmission line and the third and fourth conductors are conductors of a second coaxial transmission line.

9. The phase-shift network of claim 1, wherein the first and second conductors are conductors of a first coaxial transmission line and the third and fourth conductors are conductors of a second coaxial transmission line.

10. The phase-shift network of claim 1, further comprising a high-pass circuit coupling the input node to the first conductor.

11. A phase-difference network comprising:
a signal divider for dividing a single-ended input into first and second intermediate single-ended signals; and
first and second phase-shift networks, at least the first phase-shift network being the phase-shift network of claim 1 and responsive to the first intermediate single-ended signal for producing an output single-ended signal having a first phase that varies with frequency over a given frequency range; and the second phase-shift network being responsive to the second intermediate single-ended signal for producing an output single-ended signal having a second phase that varies with frequency and is different from the first phase by a given amount that is substantially constant over the given frequency range.

* * * * *